US010587230B2

(12) United States Patent
Tanimoto

(10) Patent No.: US 10,587,230 B2
(45) Date of Patent: *Mar. 10, 2020

(54) POWER AMPLIFICATION DEVICE AND TELEVISION SIGNAL TRANSMISSION SYSTEM

(71) Applicant: NEC CORPORATION, Tokyo (JP)

(72) Inventor: Takuya Tanimoto, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,570

(22) Filed: Feb. 15, 2019

(65) Prior Publication Data
US 2019/0181814 A1 Jun. 13, 2019

Related U.S. Application Data

(63) Continuation of application No. 15/572,876, filed as application No. PCT/JP2015/002866 on Jun. 8, 2015, now Pat. No. 10,250,204.

(51) Int. Cl.
H03F 3/193 (2006.01)
H04N 5/38 (2006.01)
(Continued)

(52) U.S. Cl.
CPC ........... *H03F 3/193* (2013.01); *H03F 1/0288* (2013.01); *H03F 1/07* (2013.01); *H03F 1/526* (2013.01);
(Continued)

(58) Field of Classification Search
CPC ........... H03F 3/193; H03F 3/21; H03F 3/602; H04N 5/38
See application file for complete search history.

(56) References Cited

U.S. PATENT DOCUMENTS 5,027,082 A 6/1991 Wisherd et al.
2001/0003433 A1 6/2001 Hu et al.
(Continued)

FOREIGN PATENT DOCUMENTS

CN 203590157 U 5/2014
JP 4-229704 A 8/1992
(Continued)

OTHER PUBLICATIONS

Communication dated Dec. 11, 2018 from the European Patent Office in application No. 15894864.6.
Communication dated Aug. 28, 2018 from the Japanese Patent Office in counterpart Application No. 2017-522753.
International Search Report for PCT/JP2015/002866 dated Jun. 30, 2015.

Primary Examiner — Michael E Teitelbaum
(74) Attorney, Agent, or Firm — Sughrue Mion, PLLC

(57) ABSTRACT

A power amplification device comprises an amplifying unit and a combining unit. The amplifying unit is provided with a plurality of groups of amplifier circuits that amplifies the power of a radio frequency signal. The plurality of groups of amplifier circuits each includes a predetermined number of the amplifier circuits. The combining unit includes a plurality of combiners. The amplifying unit is housed by a first housing and the combining unit is housed by a second housing which is separate from the first housing. The amplifying unit is configured to be attachable to and detachable from the combining unit. The amplifying unit is configurable by one or more control voltages to perform amplification in classes AB, B and/or C. The amplification in classes AB, B, and/or C is compatible with a type of the combiner.

2 Claims, 7 Drawing Sheets

(51) Int. Cl.
*H03F 1/02* (2006.01)
*H03F 1/52* (2006.01)
*H03F 3/189* (2006.01)
*H03F 3/24* (2006.01)
*H03F 3/21* (2006.01)
*H03F 3/60* (2006.01)
*H03F 1/07* (2006.01)

(52) U.S. Cl.
CPC ............... *H03F 3/189* (2013.01); *H03F 3/21* (2013.01); *H03F 3/24* (2013.01); *H03F 3/602* (2013.01); *H04N 5/38* (2013.01); *H03F 2200/451* (2013.01); *H03F 2200/552* (2013.01)

(56) References Cited

U.S. PATENT DOCUMENTS

| | | |
|---|---|---|
| 2003/0107453 A1 | 6/2003 | Kenington et al. |
| 2011/0149526 A1 | 6/2011 | Turner |
| 2012/0112833 A1 | 5/2012 | Jeong et al. |
| 2012/0235734 A1 | 9/2012 | Pengelly et al. |

FOREIGN PATENT DOCUMENTS

| | | |
|---|---|---|
| JP | 09-200105 A | 7/1997 |
| JP | 11-41117 A | 2/1999 |
| JP | 2004-140445 A | 5/2004 |
| JP | 2006-157707 A | 6/2006 |
| WO | 2014/155512 A1 | 10/2014 |
| WO | 2015/037033 A1 | 3/2015 |

POWER AMPLIFICATION DEVICE AND TELEVISION SIGNAL TRANSMISSION SYSTEM

CROSS-REFERENCE TO RELATED APPLICATIONS

This is a continuation of U.S. patent application Ser. No. 15/572,876 filed Nov. 9, 2017 (allowed), which is a National Stage entry of International Application No. PCT/JP2015/002866, filed Jun. 8, 2015. The entire disclosures of the prior applications are considered part of the disclosure of this continuation application, and are hereby incorporated by reference.

TECHNICAL FIELD

The present invention relates to a power amplification device that amplifies the power of a radio frequency (RF) signal and a television signal transmission system including such a power amplification device.

BACKGROUND ART

PTL 1 describes a power amplifier used for the power amplification of an RF signal. The power amplifier described in PTL 1 is provided with a plurality of groups each including a first amplification unit and a second amplification unit, and each group is provided with a Doherty combiner. Furthermore, the power amplifier described in PTL 1 is provided with a broadband combiner that combines output signals of each Doherty combiner. In the first amplification unit, a plurality of amplifier circuits that operates in a class AB or a class B is provided in parallel, and a combiner that combines the output signals of these amplifier circuits is further provided. In the second amplification unit, a plurality of amplifier circuits that operates in a class C is provided in parallel, and a combiner that combines the output signals of the amplifier circuits is further provided. In the power amplifier described in PTL 1, each first amplification unit, each second amplification unit, each Doherty combiner, and the broadband combiner are housed in different housings, and the Doherty combiner is easily replaceable.

PTL 2 describes a solidified short-wave band transmission system in a several tens of kW class. The solidified short-wave band transmission system described in PTL 2 includes a combining unit including a plurality of preceding stage combiners and one subsequent stage combiner. Furthermore, a plurality of individually attachable and detachable power amplifiers is provided in each preceding stage combiner. Each preceding stage combiner combines the outputs of the plurality of power amplifiers, and the subsequent stage combiner combines the outputs of the plurality of preceding stage combiners.

PTL 3 describes a configuration in which a plurality of amplification units is arranged between a distributor and a combiner. The amplification unit described in PTL 3 is formed by grouping a plurality of (for example, eight) individual selection amplifiers as one unit. To add an individual selection amplifier, the individual selection amplifier is added in units of the amplification unit.

PTL 4 describes a power combining device including a plurality of band pass filters each having a different pass band and one or a plurality of circulators. In the power combining device described in PTL 4, a first band pass filter and a second band pass filter are connected by a first circulator, and the n-th (n is a natural number) circulator and the n+2 th band pass filter are sequentially connected by the n+1 th circulator.

Furthermore, broadcasters of television broadcasting obtain authorization to do broadcasting business of transmitting television signals in a frequency band, in units of a frequency band obtained by dividing an ultra high frequency (UHF) band (470 to 862 MHz) or a very high frequency (VHF) band (170 to 230 MHz) by a fixed bandwidth. For example, a broadcaster using the UHF band obtains authorization to do broadcasting business in units of a frequency band obtained by dividing the UHF band by a bandwidth of 8 MHz. Note that a bandwidth when the UHF band is divided by country may be 6 MHz or 7 MHz.

CITATION LIST

Patent Literature

PTL 1: International Publication No. WO2014/155512
PTL 2: Japanese Patent Application Laid-Open No. 11-41117
PTL 3: Japanese Patent Application Laid-Open No. 9-200105
PTL 4: Japanese Patent Application Laid-Open No. 2004-140445

SUMMARY OF INVENTION

Technical Problem

Furthermore, as an exemplary configuration of a general power amplification device used in a television signal transmission system, a configuration illustrated in FIG. 7 is conceivable. A general power amplification device 90 illustrated in FIG. 7 is an integrated type device including a plurality of amplifier circuits 91, a plurality of preceding stage combiners 92, and a subsequent stage combiner 93. In FIG. 7, an exemplary case where four amplifier circuits 91 and two preceding stage combiners 92 are provided is illustrated. Two amplifier circuits 91 are connected to each preceding stage combiners 92. Each amplifier circuit 91 amplifies the power of an input RF signal and outputs the RF signal after power amplification to the preceding stage combiner 92. Each preceding stage combiner 92 combines the RF signals output from the two amplifier circuits 91, and outputs the RF signal after combining to the subsequent stage combiner 93. The subsequent stage combiner 93 combines the RF signals output from the two preceding stage combiners 92, and outputs the RF signal after combining to a subsequent stage device (not illustrated in FIG. 7) of the power amplification device 90. Note that the above-described RF signal is a signal transmitted as a television signal.

Each amplifier circuit 91 amplifies the power of a broadband RF signal. For example, each amplifier circuit 91 is an amplifier circuit usable for the full UHF band or the full VHF band. Meanwhile, in the power amplification device 90, an element relating to the combining of RF signals (particularly, the preceding stage combiner 92) combines RF signals in a specific frequency band. That is, the element relating to signal combining (particularly, the preceding stage combiner 92) in the power amplification device 90 combines the RF signals in the frequency band for which the broadcaster is authorized.

A manufacturer manufacturing the power amplification device 90 manufactures the power amplification device 90 for each broadcaster according to a frequency band for which the broadcaster is authorized. However, since the amplifier circuit 91 amplifies the power of a broadband RF signal, it is preferable for the manufacturer to manufacture an element relating to the power amplification of the RF signal (collection of the amplifier circuits 91) in the power amplification device 90 such that the element is made common regardless of the broadcaster and to supply the manufactured common element to each broadcaster.

Furthermore, the broadcaster may also be authorized for broadcasting business with respect to plural kinds of frequency bands. In this case, the broadcaster uses the power amplification device 90 illustrated in FIG. 7 for each authorized frequency band. The general power amplification device 90 illustrated in FIG. 7 is an integrated type device. Therefore, in a case where a failure occurs in the amplifier circuit 91, the whole power amplification device 90 will be replaced. If it is assumed that an element relating to the power amplification of the RF signal (collection of amplifier circuits 91) in the power amplification device 90 is made common regardless of the broadcaster and can be separated from an element relating to the signal combining, even if a failure occurs in the amplifier circuit 91 in any power amplification device 90 among plural kinds of power amplification devices 90, it is possible to replace only a portion corresponding to the element relating to the power amplification. However, the general power amplification device 90 illustrated in FIG. 7 is an integrated type device, and it is difficult to replace only the portion corresponding to the element relating to the power amplification.

Therefore, if the portion corresponding to the element relating to the power amplification of the RF signal in the power amplification device 90 (collection of the amplifier circuits 91) can be manufactured such that the portion is made common and separated from the element relating to the signal combining, this is preferable for the broadcaster authorized for broadcasting business with respect to plural kinds of frequency bands and for the manufacturer of the power amplification device.

It is therefore an object of the present invention to provide a power amplification device capable of detaching an element relating to the power amplification of an RF signal from an element relating to the combining of RF signals, and a television signal transmission system including the power amplification device.

Solution to Problem

A power amplification device according to the present invention includes an amplifying unit provided with a plurality of groups of amplifier circuits that amplifies the power of a radio frequency (RF) signal and that each includes a predetermined number of the amplifier circuits and a combining unit including first combiners that are provided in association with the groups, combine RF signals output from the amplifier circuits belonging to the corresponding group, and output the RF signal after combining and a second combiner that combines the RF signals output from each first combiner and outputs the RF signal after combining. Each first combiner is a combiner usable for an RF signal in a specific frequency band and the amplifying unit is attachable to and detachable from the combining unit.

Furthermore, a television signal transmission system according to the present invention includes the above-described power amplification device.

Advantageous Effects of Invention

According to the present invention, in the power amplification device, the element relating to the power amplification of an RF signal can be detached from the element relating to the combining of RF signals.

DESCRIPTION OF EMBODIMENTS

Hereinafter, exemplary embodiments of the present invention will be described with reference to the drawings.

First Exemplary Embodiment

Figure 1:
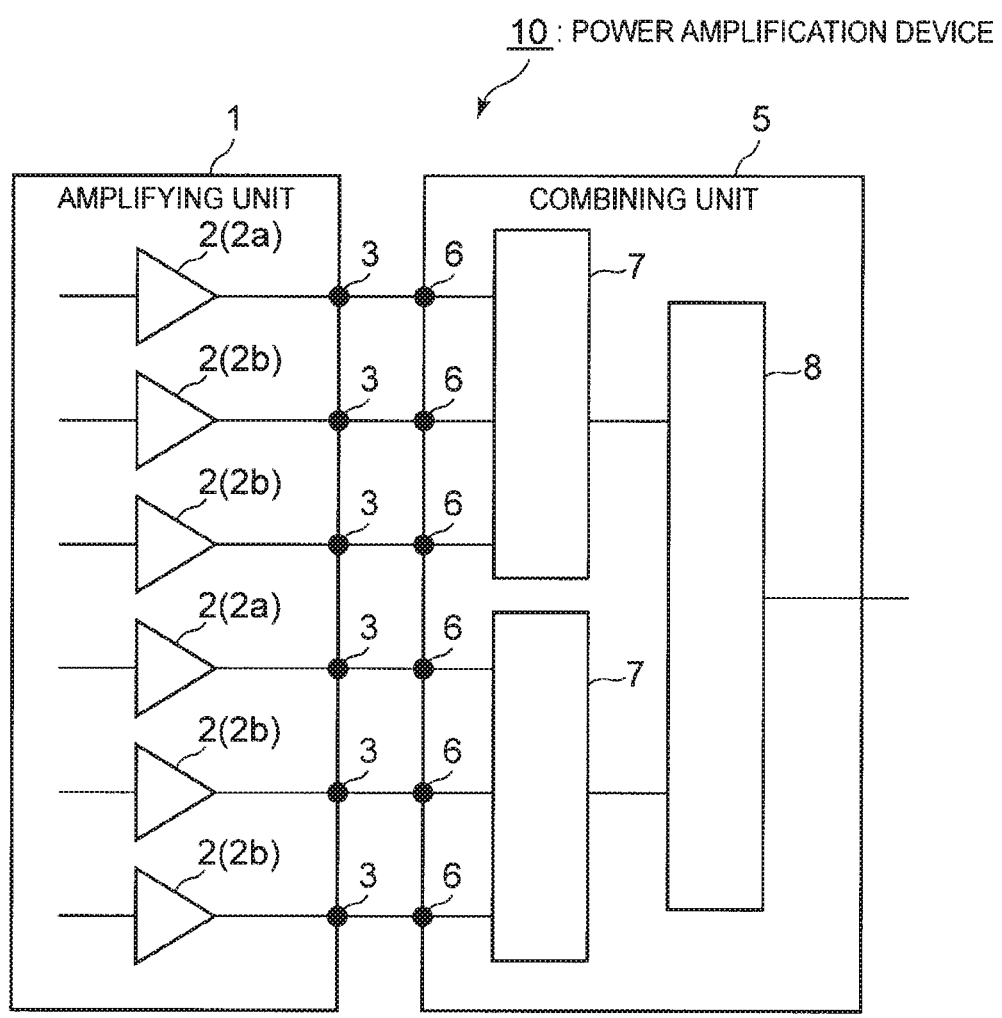
FIG. 1 It depicts a block diagram illustrating an exemplary configuration of a power amplification device according to a first exemplary embodiment of the present invention.

FIG. 1 is a block diagram illustrating an exemplary configuration of a power amplification device according to a first exemplary embodiment of the present invention. The power amplification device 10 according to the present exemplary embodiment includes an amplifying unit 1 and a combining unit 5.

The amplifying unit 1 includes a plurality of amplifier circuits 2. Specifically, the amplifying unit 1 is provided with a plurality of groups of the amplifier circuits 2, and the plurality of groups of the amplifier circuits 2 each includes a predetermined number of the amplifier circuits 2. In FIG. 1, an exemplary case where three amplifier circuits 2 are grouped as one group, and two groups of the amplifier circuits 2 are provided is illustrated. The number of groups of the amplifier circuits 2 provided in the amplifying unit 1 may be three or more.

Each amplifier circuit 2 amplifies the power of an input RF signal and outputs the RF signal after power amplification. This RF signal is a signal transmitted as a television signal.

Furthermore, each amplifier circuit 2 is achieved with, for example, a field effect transistor (FET). Hereinafter, description will be given by exemplifying a case where each amplifier circuit 2 is achieved with the FET.

The amplifying unit 1 does not include a circuit that combines RF signals.

The combining unit 5 includes a plurality of first combiners 7 and one second combiner 8. The first combiner 7 is provided in association with the group of the amplifier circuits 2 provided in the amplifying unit 1. In an example illustrated in FIG. 1, since the three amplifier circuits 2 are grouped as one group and two groups of the amplifier circuits 2 are provided, the combining unit 5 is provided with two first combiners 7. RF signal output from each amplifier circuit 2 belonging to the group corresponding to the first combiner 7 is input to the first combiner 7, and the first combiner 7 combines the RF signals and outputs the RF signal after combining to the second combiner 8. In this example, the RF signals output from the three amplifier circuits 2 belonging to the group corresponding to the first combiner 7 are input to the first combiner 7.

Figure 4:
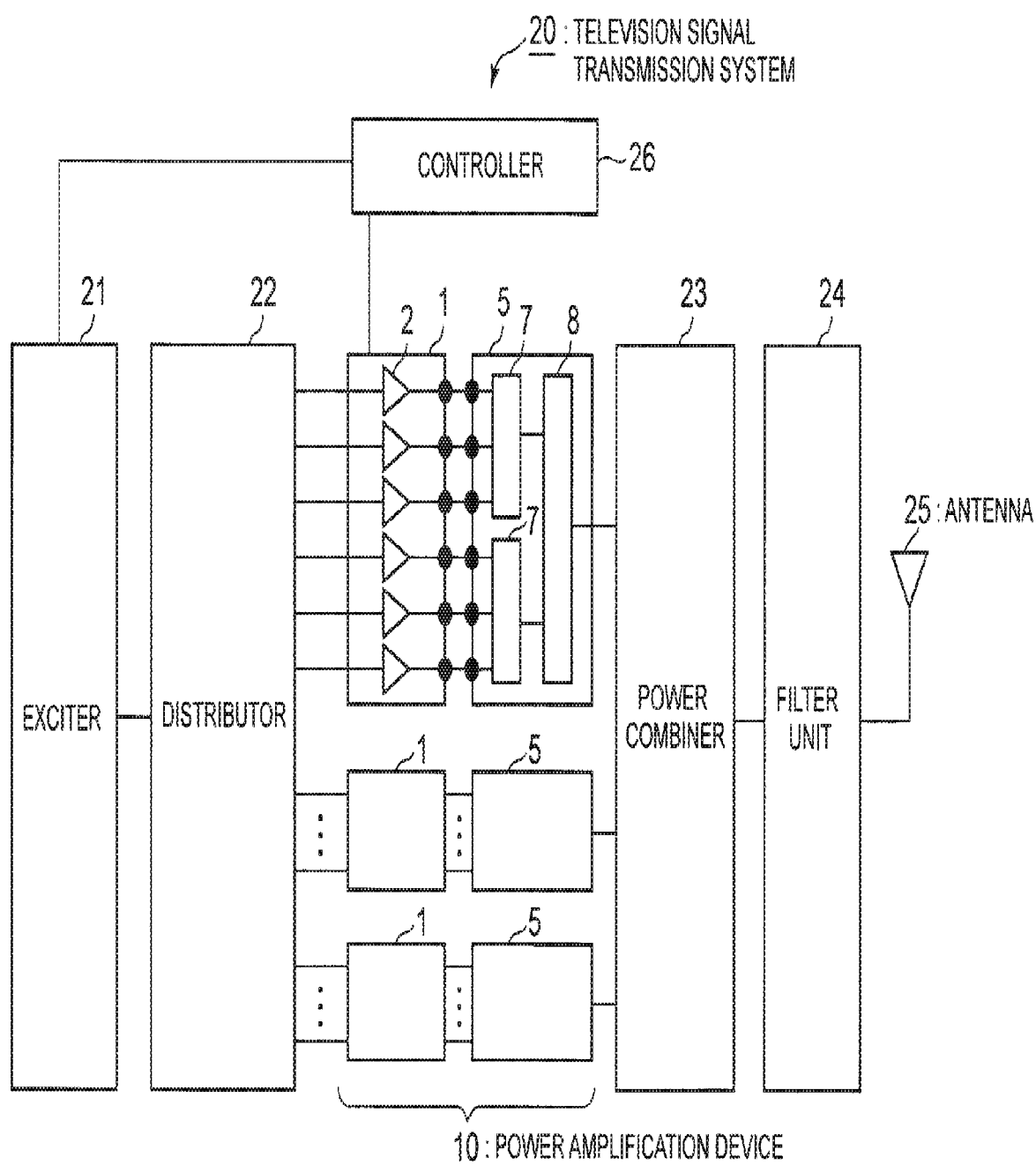
FIG. 4 It depicts a block diagram illustrating an exemplary configuration of a television signal transmission system according to a third exemplary embodiment of the present invention.

The second combiner 8 combines the RF signals output from each first combiner 7, and outputs the RF signal after combining to a power combiner (not illustrated in FIG. 1). As illustrated in FIG. 4 to be described later, the power combiner is a subsequent stage device of the power amplification device 10. The power combiner transmits the RF signal (television signal) via an antenna.

The frequency band of the RF signal that can be amplified by each amplifier circuit 2 is broadband. For example, each amplifier circuit 2 is an amplifier circuit usable for the full UHF band or the full VHF band.

Meanwhile, the first combiner 7 is a combiner usable for an RF signal in a specific frequency band. In other words, the first combiner 7 is a combiner in which the frequency band of a combinable RF signal is limited. The first combiner 7 combines RF signals in a frequency band for which the broadcaster of a television broadcast using the power amplification device 10 is authorized. As already described, the broadcaster obtains authorization for broadcasting business in units of a frequency band obtained by dividing the UHF band or the VHF band by a fixed bandwidth. The first combiner 7 is designed to be capable of combining RF signals in the frequency band for which the broadcaster is authorized.

As the first combiner 7, for example, a Doherty combiner is used. The Doherty combiner is a combiner that combines an RF signal output from a main amplifier that typically performs an operation of amplifying an RF signal (hereinafter referred to as main amplifier) and an RF signal output from a peak amplifier that operates at a high power output (hereinafter referred to as peak amplifier). Hereinafter, in the present exemplary embodiment, description will be given by exemplifying a case where each first combiner 7 is a Doherty combiner.

The Doherty combiner has a transmission line (for example, a copper plate) (not illustrated), and can adjust the frequency band of the combinable RF signal according to the length of the transmission line. When the first combiner 7 is manufactured, the frequency band of the combinable RF signal is adjusted according to the frequency band for which a broadcaster using the power amplification device 10 is authorized.

In a case where the Doherty combiner is used as the first combiner 7, the group corresponding to the first combiner 7 (group of amplifier circuits 2) includes an amplifier circuit 2 corresponding to the main amplifier and an amplifier circuit 2 corresponding to the peak amplifier. Hereinafter, the amplifier circuit corresponding to the main amplifier is denoted by reference sign 2a, and the amplifier circuit corresponding to the peak amplifier by reference sign 2b. In the present exemplary embodiment, one of the three amplifier circuits 2 included in one group is an amplifier circuit 2a corresponding to the main amplifier and the remaining two amplifier circuits 2 are amplifier circuits 2b corresponding to the peak amplifier.

Whether the amplifier circuit 2 is used as the main amplifier or the peak amplifier can be changed by setting for the amplifier circuit 2. Specifically, depending on how a bias voltage is applied to the amplifier circuit 2, it is possible to determine whether to use the amplifier circuit 2 as the main amplifier or as the peak amplifier.

A bias voltage is applied to the amplifier circuit 2a operated as the main amplifier so as to perform a class AB operation or a class B operation.

The bias voltage is applied to the amplifier circuit 2b operated as the peak amplifier so as to perform a class C operation.

As a result, each first combiner 7 combines an RF signal output by the one amplifier circuit 2a configured to perform the class AB operation or the class B operation and RF signals output from the two amplifier circuits 2b configured to perform the class C operation.

The second combiner 8 is any combiner capable of combining broadband RF signals. For example, the second combiner 8 is any combiner capable of combining RF signals in the full UHF band or in the full VHF band. For example, a 3 dB coupler may be used as the second combiner 8.

Furthermore, a Wilkinson combiner may be used as the second combiner 8.

Furthermore, a housing of the amplifying unit 1 and a housing of the combining unit 5 are separate housings, and the amplifying unit 1 is configured to be attachable to and detachable from the combining unit 5.

The amplifying unit 1 includes the same number of output ports 3 as the number of amplifier circuits 2 included in the amplifying unit 1, and the amplifier circuit 2 is associated on a one-on-one basis with the output port 3. The output port 3 is an interface that outputs, from the amplifying unit 1, the RF signal output by the corresponding amplifier circuit 2. In the example illustrated in FIG. 1, since the amplifying unit 1 includes six amplifier circuits 2, the amplifying unit 1 has six output ports 3. Furthermore, the combining unit 5 includes the same number of input ports 6 as the number of the output ports 3 included in the amplifying unit 1. The output port 3 of the amplifying unit 1 is associated on a one-on-one basis with the input port 6 of the combining unit 5. Therefore, it can be said that the amplifier circuit 2 is also associated on a one-on-one basis with the input port 6. The input port 6 corresponding to the amplifier circuit 2 is connected to the first combiner 7 corresponding to the group (group of amplifier circuits 2) to which the amplifier circuit 2 belongs. The input port 6 is an interface that inputs, to the first combiner 7 of the combining unit 5, the RF signal output from the output port 3 of the amplifying unit 1.

The input port 6 is arranged so as to be connected to the corresponding output port 3 when the amplifying unit 1 is attached to the combining unit 5. Therefore, when the amplifying unit 1 is attached to the combining unit 5, the output port 3 and the input port 6 that correspond to each other are connected, and the RF signal output from the amplifier circuit 2 is input to the first combiner 7 corresponding the group to which the amplifier circuit 2 belongs.

Since the amplifying unit 1 is attachable to and detachable from the combining unit 5, when a failure occurs in the amplifying unit 1, the amplifying unit 1 can be detached from the combining unit 5, and another amplifying unit 1 in which no failure has occurred can be attached to the combining unit 5.

Figure 2:
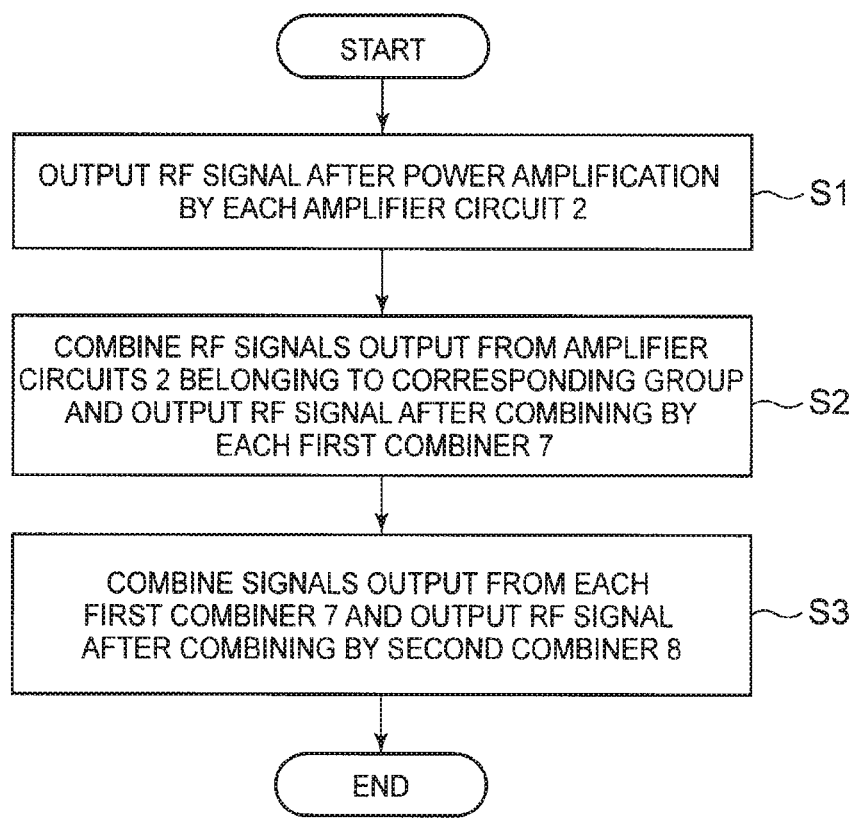
FIG. 2 It depicts a flowchart illustrating an exemplary process progress of the power amplification device.

Next, a process progress of the power amplification device 10 will be described. FIG. 2 is a flowchart illustrating an exemplary process progress of the power amplification device 10. However, it is assumed that the amplifying unit 1 is attached to the combining unit 5 and the power amplification device 10 is in operation.

An RF signal is input to one amplifier circuit 2a and two amplifier circuits 2b that form a group. The frequency band of this RF signal is within the frequency band for which the broadcaster using the power amplification device 10 is authorized. The amplifier circuit 2a operates as the main amplifier, the amplifier circuit 2b operates as the peak amplifier, and the amplifier circuits 2a and 2b output RF signals after power amplification to the first combiner 7 corresponding to the group. Each group of the amplifier circuits 2 operates in a similar manner (step S1).

Each first combiner 7 combines RF signals output from one amplifier circuit 2a and two amplifier circuits 2b belonging to the corresponding group and outputs the RF signal after combining to the second combiner 8 (step S2).

The second combiner 8 combines the RF signals output from each first combiner 7 and outputs the RF signal after combining to the power combiner (not illustrated in FIG. 1) (step S3). Note that the power combiner transmits the RF signal via the antenna.

According to the present exemplary embodiment, the amplifying unit 1 that performs the power amplification of an RF signal is attachable to and detachable from the combining unit 5 that combines RF signals. Therefore, the element relating to the power amplification of an RF signal can be detached from the element relating to the combining of RF signals. Specifically, the amplifying unit 1 can be detached from the combining unit 5.

Therefore, for a manufacturer who manufactures the power amplification device 10, it is possible to manufacture the amplifying unit 1 such that the amplifying unit 1 is made common regardless of the broadcaster.

It is also assumed that the broadcaster is authorized for broadcasting business with respect to plural kinds of frequency bands and uses different power amplification devices 10 for each frequency band that is authorized. Among the power amplification devices 10, the amplifying unit 1 is made common regardless of the frequency band. Therefore, if the broadcaster has a spare amplifying unit 1, even if a failure occurs in the amplifying unit 1 of any power amplification device 10, the broadcaster can replace the faulty amplifying unit 1 with the spare amplifying unit 1 and quickly restore the power amplification device 10.

Furthermore, as described above, the broadcaster obtains authorization for broadcasting business in units of a frequency band obtained by dividing the UHF band or the VHF band by a fixed bandwidth. The first combiner 7 is designed to be capable of combining RF signals in the frequency band for which the broadcaster is authorized. According to the present invention, no combiner is included in the amplifying unit 1, and in a case where the amplifying unit 1 is attached to the combining unit 5, RF signals in the frequency band for which the broadcaster is authorized can be combined by the first combiner 7. That is, it is possible to appropriately determine the frequency bandwidth of the RF signal combinable by the first combiner 7.

Furthermore, with a Doherty combiner as the first combiner 7, it is possible to improve power consumption efficiency at the time of the power amplification of the RF signal. In a case where the Doherty combiner is used, a plurality of amplifier circuits 2 that outputs RF signals to the Doherty combiner is set as the main amplifier or the peak amplifier. Then, it is possible to improve the power consumption efficiency at the time of the power amplification of the RF signal. Furthermore, by improving the power consumption efficiency at the time of the power amplification, it is possible to achieve low power consumption.

The above description has illustrated a case where one of the three amplifier circuits 2 included in one group is the amplifier circuit 2a corresponding to the main amplifier, and the remaining two amplifier circuits 2 are the amplifier circuits 2b corresponding to the peak amplifier. Among the three amplifier circuits 2 included in one group, two amplifier circuits 2 may be the amplifier circuits 2a corresponding to the main amplifier and the remaining one amplifier circuit 2 may be the amplifier circuit 2b corresponding to the peak amplifier.

Second Exemplary Embodiment

Figure 3:
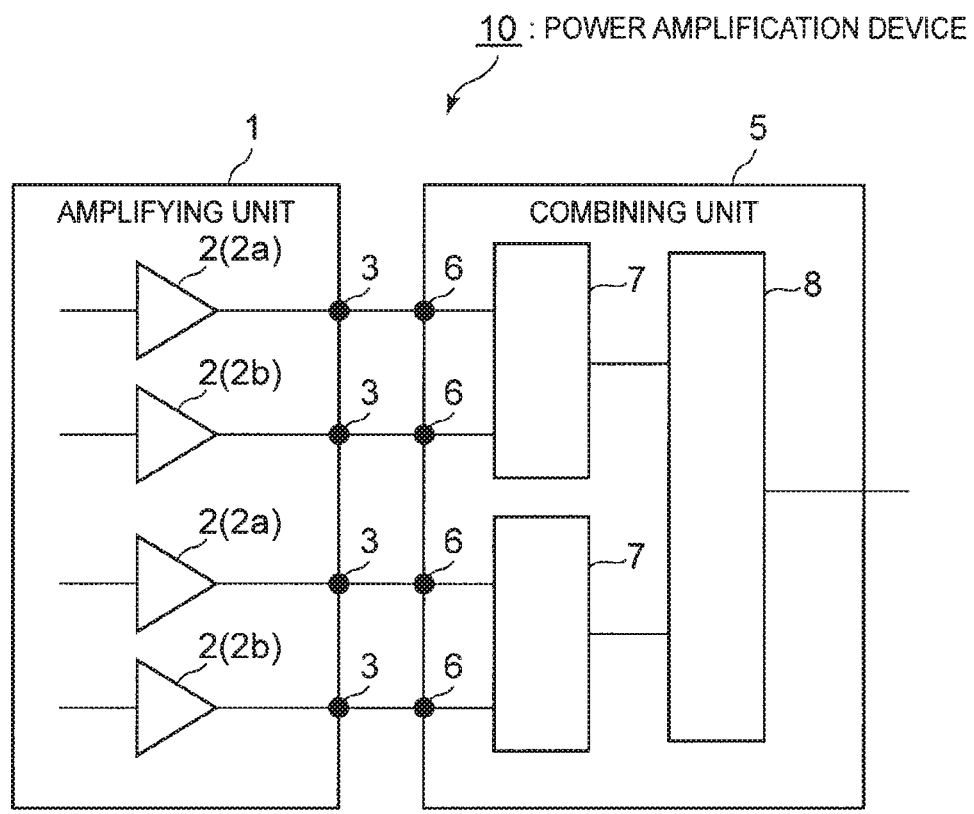
FIG. 3 It depicts a block diagram illustrating an exemplary configuration of a power amplification device according to a second exemplary embodiment of the present invention.

FIG. 3 is a block diagram illustrating an exemplary configuration of a power amplification device according to a second exemplary embodiment of the present invention. Constituent elements similar to those in the first exemplary embodiment are denoted by the same reference signs as those in FIG. 1, and detailed description thereof will be omitted. The power amplification device 10 according to the second exemplary embodiment also includes an amplifying unit 1 and a combining unit 5.

Also in the second exemplary embodiment, the amplifying unit 1 is provided with a plurality of groups of amplifier circuits 2, and the plurality of groups of amplifier circuits 2 each includes a predetermined number of the amplifier circuits 2. However, in the second exemplary embodiment, the number of the amplifier circuits 2 included in one group is two. Note that the number of groups of the amplifier circuits 2 provided in the amplifying unit 1 may be three or more. In FIG. 3, an exemplary case where two amplifier circuits 2 are grouped as one group and two groups of the amplifier circuits 2 are provided is illustrated.

As with the combining unit 5 in the first exemplary embodiment, the combining unit 5 includes a plurality of first combiners 7 and one second combiner 8. The first combiner 7 is provided in association with the group of the amplifier circuits 2 provided in the amplifying unit 1. In the example illustrated in FIG. 3, since the two amplifier circuits 2 are grouped as one group and two groups of the amplifier circuits 2 are provided, the combining unit 5 is provided with two first combiners 7. RF signals output from the two amplifier circuits 2 belonging to the group corresponding to the first combiner 7 is input to the first combiner 7, and the first combiner 7 combines the RF signals, and outputs the RF signal after combining to the second combiner 8.

As with the first combiner 7 in the first exemplary embodiment, the first combiner 7 is a combiner usable for an RF signal in a specific frequency band. In other words, the first combiner 7 is a combiner in which the frequency band of a combinable RF signal is limited. Also in the second exemplary embodiment, description will be given by exemplifying a case where each first combiner 7 is a Doherty combiner.

In the second exemplary embodiment, a group (group of amplifier circuits 2) corresponding to the first combiner 7 includes two amplifier circuits 2. In a case where the Doherty combiner is used as the first combiner 7, one of the two amplifier circuits 2 belonging to one group is used as a main amplifier and the other is used as a peak amplifier.

A bias voltage is applied to the amplifier circuit 2a operated as the main amplifier so as to perform a class AB operation or a class B operation. Furthermore, the bias voltage is applied to an amplifier circuit 2b operated as the peak amplifier so as to perform a class C operation.

As a result, each first combiner 7 combines the RF signal output by the one amplifier circuit 2a configured to perform the class AB operation or the class B operation and the RF signal output from the one amplifier circuit 2b configured to perform the class C operation.

The second combiner 8 is similar to the second combiner 8 in the first exemplary embodiment.

Also in the second exemplary embodiment, a housing of the amplifying unit 1 and a housing of the combining unit 5 are separate housings, and the amplifying unit 1 is configured to be attachable to and detachable from the combining unit 5.

An output port 3 included in the amplifying unit 1 and an input port 6 included in the combining unit 5 are similar to the output port 3 and the input port 6 in the first exemplary embodiment, respectively. In the example illustrated in FIG. 3, since the number of the amplifier circuits 2 included in the amplifying unit 1 is four, the amplifying unit 1 is provided with four output ports 3, and the combining unit 5 is provided with four input ports.

A process progress of the power amplification device 10 according to the second exemplary embodiment is similar to that in steps S1 to S3 described in the first exemplary embodiment, and the description thereof is omitted.

The effects of the second exemplary embodiment are similar to the effects of the first exemplary embodiment.

Furthermore, in the description of the first exemplary embodiment and the second exemplary embodiment, description has been given by exemplifying the case where each first combiner 7 is a Doherty combiner. Each first combiner 7 is not limited to the Doherty combiner, and each first combiner 7 is any combiner in which the frequency band of a combinable RF signal is limited. For example, each first combiner 7 may be a Wilkinson combiner.

In a case where the first combiner 7 is the Wilkinson combiner, all the amplifier circuits 2 belonging to the group corresponding to the first combiner 7 are configured to perform the class AB operation. For example, as in the second exemplary embodiment, it is assumed that two amplifier circuits 2 are grouped as one group and a plurality of groups of the amplifier circuits 2 is provided in the amplifying unit 1. Furthermore, it is assumed that the Wilkinson combiner is provided in the combining unit 5 as the first combiner 7 corresponding to each group. In this case, a bias voltage is applied to each amplifier circuit 2 belonging to each group so as to perform the class AB operation.

However, power consumption efficiency at the time of power amplification is higher in a case where the Doherty combiner is used as the first combiner 7 than in a case where the Wilkinson combiner is used as the first combiner 7. Therefore, it is more preferable to use the Doherty combiner as the first combiner 7.

Third Exemplary Embodiment

Next, as a third exemplary embodiment of the present invention, a television signal transmission system will be described. FIG. 4 is a block diagram illustrating an exemplary configuration of the television signal transmission system according to the third exemplary embodiment of the present invention. Constituent elements similar to those in the first exemplary embodiment and the second exemplary embodiment are denoted by the same reference signs as those in FIG. 1 and FIG. 3, and description thereof is omitted.

The television signal transmission system 20 according to the present invention includes a power amplification device 10 including an amplifying unit 1 and a combining unit 5 described above. The number of power amplification devices 10 included in the television signal transmission system 20 is not limited to one. In FIG. 4, an exemplary case where the television signal transmission system 20 includes three power amplification devices 10 is illustrated. In FIG. 4, although illustrations of an amplifier circuit 2, a first combiner 7, a second combiner 8 and the like are omitted for the two power amplification devices 10, each power amplification device 10 has a similar configuration.

Furthermore, in FIG. 4, an exemplary case where the television signal transmission system 20 includes the power amplification device 10 (refer to FIG. 1) described in the first exemplary embodiment. The television signal transmission system 20 may include the power amplification device 10 (refer to FIG. 3) described in the second exemplary embodiment.

Furthermore, the television signal transmission system 20 includes an exciter 21, a distributor 22, a power combiner 23, a filter unit 24, an antenna 25, and a controller 26.

The exciter 21 is connected to the distributor 22. The exciter 21 generates an RF signal to be transmitted as a television signal and outputs the RF signal to the distributor 22. The frequency band of this RF signal is a frequency band for which a broadcaster using the television signal transmission system 20 is authorized.

The distributor 22 is connected to the amplifying unit 1 of each power amplification device 10. The amplifying unit 1 is also configured to be attachable to and detachable from the distributor 22.

The distributor 22 distributes the RF signal output from the exciter 21 to each amplifier circuit 2 provided in the amplifying unit 1 of each power amplification device 10.

The power combiner 23 is connected to the combining unit 5 of each power amplification device 10. The combining unit 5 may be configured to be attachable to and detachable from the power combiner 23.

The power combiner 23 performs power combining of RF signals output from the combining unit 5 of each power amplification device 10, and then outputs the RF signal after power combining via the filter unit 24 and the antenna 25.

The filter unit 24 is a band pass filter that allows passage of only an RF signal in a frequency band for which the broadcaster using the television signal transmission system 20 is authorized.

The controller 26 switches on and off the operation of the exciter 21 and monitors a state of each amplifying unit 1.

Figure 5:
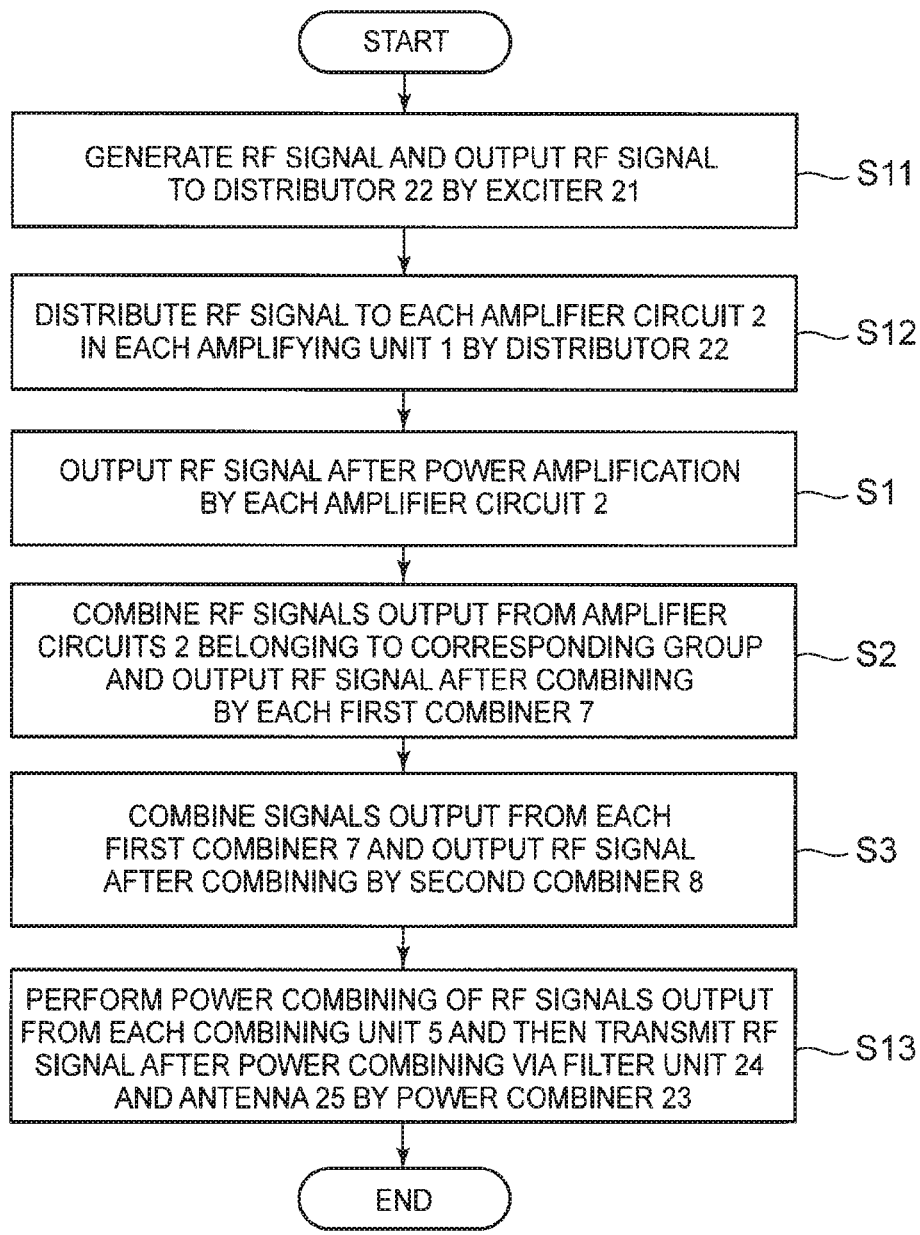
FIG. 5 It depicts a flowchart illustrating an exemplary process progress of the television signal transmission system.

Next, a process progress of the television signal transmission system 20 will be described. FIG. 5 is a flowchart illustrating an exemplary process progress of the television signal transmission system 20.

The exciter 21 generates an RF signal and outputs the RF signal to the distributor 22 (step S11).

Next, the distributor 22 distributes the RF signal output from the exciter 21 to each amplifier circuit 2 in each amplifying unit 1 (step S12).

The operation of the power amplification device 10 after step S12 is similar to the operation (steps S1 to S3) described above, and the description thereof will be omitted here.

After step S3, the power combiner 23 performs power combining of RF signals output from each combining unit 5, and then transmits an RF signal after power combining via the filter unit 24 and the antenna 25 (step S13).

The television signal transmission system 20 according to the present exemplary embodiment includes a power amplification device 10 (refer to FIG. 1) described in the first exemplary embodiment or a power amplification device 10 (refer to FIG. 3) described in the second exemplary embodiment. Therefore, also in the present exemplary embodiment, effects similar to those of the first exemplary embodiment and the second exemplary embodiment can be obtained.

Note that the television signal transmission system 20 may include the power amplification device 10 including a Wilkinson combiner as the first combiner 7.

Figure 6:
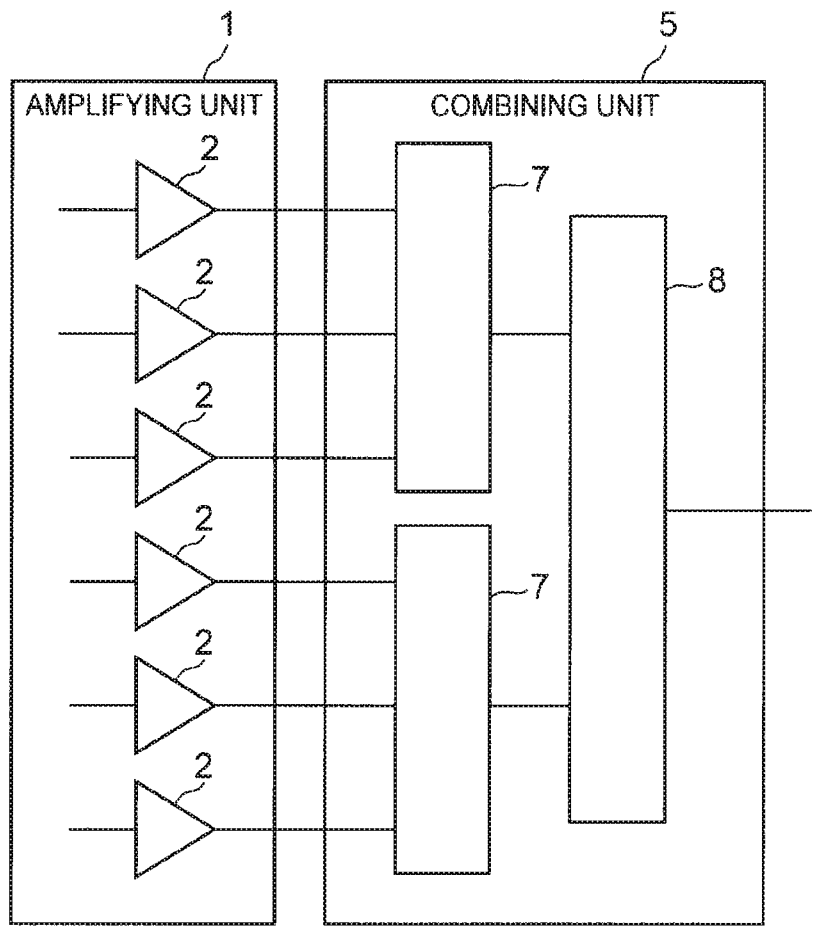
FIG. 6 It depicts a block diagram illustrating an outline of the power amplification device according to the present invention.
Figure 7:
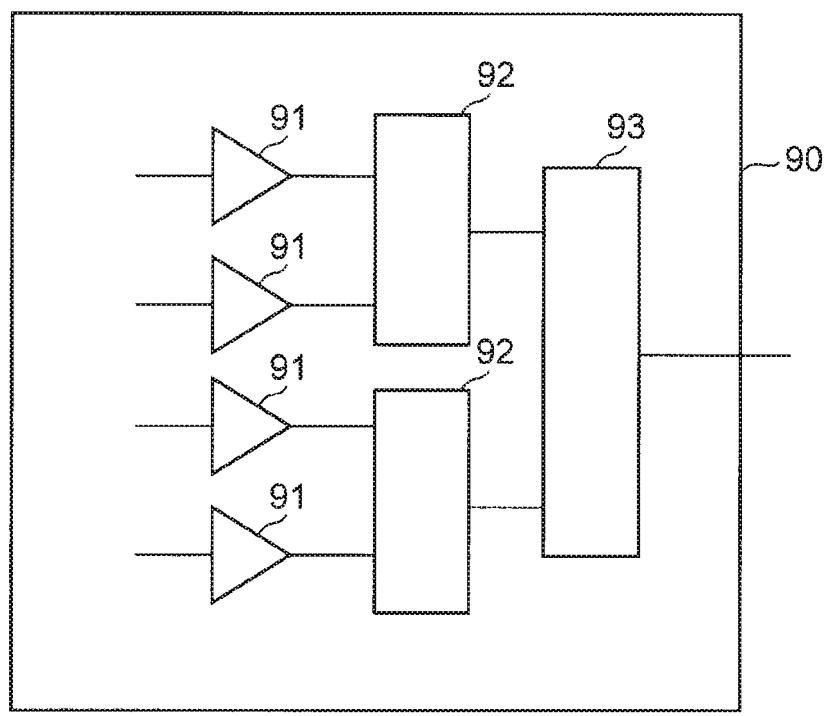
FIG. 7 It depicts a block diagram illustrating an exemplary configuration of a general power amplification device.

Next, an outline of the present invention will be described. FIG. 6 is a block diagram illustrating an outline of the present invention. The power amplification device according to the present invention includes the amplifying unit 1 and the combining unit 5.

The amplifying unit 1 is provided with a plurality of groups of the amplifier circuits 2 that amplifies the power of a RF signal and the plurality of groups of amplifier circuits each includes a predetermined number of the amplifier circuits 2.

The combining unit 5 includes the first combiner 7 and the second combiner 8. The first combiner 7 is provided in association with the group of the amplifier circuits 2, and combines RF signals output from the amplifier circuits 2 belonging to the corresponding group and outputs the RF signal after combining. The second combiner 8 combines the RF signals output from each first combiner 7 and outputs the RF signal after combining.

Each first combiner 7 is a combiner usable for an RF signal in a specific frequency band.

Furthermore, the amplifying unit 1 is attachable to and detachable from the combining unit 5.

With such a configuration, in the power amplification device, an element relating to the power amplification of an RF signal can be detached from an element relating to the combining of RF signals.

The above-described exemplary embodiments can also be described as following supplementary notes, but the exemplary embodiments are not limited to the following.

(Supplementary note 1) A power amplification device includes an amplifying unit that is provided with a plurality of groups of amplifier circuits that amplifies the power of a radio frequency (RF) signal and that each includes a predetermined number of the amplifier circuits, and a combining unit including first combiners that are provided in association with the groups, combine RF signals output from the amplifier circuit belonging to a corresponding group, and output the RF signal after combining and a second combiner that combines the RF signals output from each first combiner and outputs the RF signal after combining. Each first combiner is a combiner usable for an RF signal in a specific frequency band and the amplifying unit is attachable to and detachable from the combining unit.

(Supplementary note 2) The power amplification device according to supplementary note 1 in which each first combiner is a Doherty combiner.

(Supplementary note 3) The power amplification device according to supplementary note 1 or 2 in which the groups of the amplifier circuits each include three amplifier circuits. One of the three amplifier circuits is an amplifier circuit configured to perform a class AB operation or a class B operation. The remaining two amplifier circuits are amplifier circuits configured to perform a class C operation. Each first combiner is the Doherty combiner.

(Supplementary note 4) The power amplification device according to supplementary note 1 or 2 in which the groups of the amplifier circuits each include two amplifier circuits. One of the two amplifier circuits is an amplifier circuit configured to perform a class AB or class B operation. The remaining one amplifier circuit is an amplifier circuit configured to perform a class C operation. Each first combiner is the Doherty combiner.

(Supplementary note 5) A television signal transmission system including the power amplification device according to any of supplementary notes 1 to 4.

INDUSTRIAL APPLICABILITY

The present invention is appropriately applied to a television signal transmission system and a power amplification device provided in the television signal transmission system.

REFERENCE SIGNS LIST

1 Amplifying unit
2 Amplifier circuit
3 Output port
5 Combining unit
6 Input port
7 First combiner
8 Second combiner
10 Power amplification device
20 Television signal transmission system
21 Exciter
22 Distributor
23 Power combiner
24 Filter unit
25 Antenna
26 Controller

The invention claimed is:
1. A power amplification device comprising:
an amplifying unit provided with a plurality of groups of amplifier circuits that amplifies the power of a radio frequency (RF) signal, the plurality of groups of amplifier circuits each including a predetermined number of the amplifier circuits; and
a combining unit including a plurality of combiners,
wherein at least one of the combiners is a combiner usable for an RF signal in a specific frequency band,
the amplifying unit is housed by a first housing and the combining unit is housed by a second housing which is separate from the first housing, and the amplifying unit is configured to be attachable to and detachable from the combining unit,
each amplifier circuit provided in the amplifying unit is a field effect transistor (FET),
the amplifying unit is configurable by one or more control voltages to perform amplification in classes AB, B and/or C, and
the amplification in classes AB, B, and/or C is compatible with a type of the combiner.

2. A power amplification device comprising:
an amplifying unit that is provided with a plurality of groups of amplifier circuits that amplifies the power of a radio frequency (RF) signal, the plurality of groups of amplifier circuits each including a predetermined number of the amplifier circuits; and
a combining unit including a plurality of combiners,
wherein at least one of the combiners is a combiner usable for an RF signal in a specific frequency band,
the amplifying unit is housed by a first housing and the combining unit is housed by a second housing which is separate from the first housing, and the combining unit is attachable and detachable,
each amplifier circuit provided in the amplifying unit is a field effect transistor (FET), the amplifying unit is configurable by one or more control voltages to perform amplification in classes AB, B and/or C, and the amplification in classes AB, B, and/or C is compatible with a type of the combiner.

\* \* \* \* \*